(12) United States Patent
Liu

(10) Patent No.: US 12,324,241 B2
(45) Date of Patent: Jun. 3, 2025

(54) METHOD FOR PREPARING DISPLAY PANEL, DISPLAY PANEL, AND ELECTRONIC DEVICE

(71) Applicant: TCL China Star Optoelectronics Technology Co., Ltd., Guangdong (CN)

(72) Inventor: Linfeng Liu, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/621,998

(22) PCT Filed: Dec. 8, 2021

(86) PCT No.: PCT/CN2021/136594
§ 371 (c)(1),
(2) Date: Dec. 22, 2021

(87) PCT Pub. No.: WO2023/092661
PCT Pub. Date: Jun. 1, 2023

(65) Prior Publication Data
US 2024/0297175 A1    Sep. 5, 2024

(30) Foreign Application Priority Data

Nov. 24, 2021 (CN) .......................... 202111405349.X

(51) Int. Cl.
  *H10D 86/60*    (2025.01)
  *H01L 25/075*   (2006.01)
  (Continued)

(52) U.S. Cl.
  CPC .......... *H10D 86/60* (2025.01); *H01L 25/0753* (2013.01); *H01L 25/167* (2013.01);
  (Continued)

(58) Field of Classification Search
  CPC .............. H01L 27/124; H01L 25/0753; H01L 27/1266; H01L 33/62
  See application file for complete search history.

(56) References Cited

U.S. PATENT DOCUMENTS

| 2012/0115262 A1 | 5/2012 | Menard et al. |
| 2017/0243773 A1 | 8/2017 | Hwang |
| 2021/0143045 A1* | 5/2021 | Wang .................. H01L 21/6838 |

FOREIGN PATENT DOCUMENTS

| CN | 109786307 A | 5/2019 | |
| CN | 110707119 A * | 1/2020 | ........... H01L 27/156 |

(Continued)

OTHER PUBLICATIONS

International Search Report in International application No. PCT/CN2021/136594, mailed on Apr. 26, 2022.
(Continued)

*Primary Examiner* — Walter H Swanson
*Assistant Examiner* — Moataz Khalifa
(74) *Attorney, Agent, or Firm* — Nathan & Associates; Menachem Nathan

(57) ABSTRACT

A method for preparing a display panel, a display panel, and an electronic device are provided. In the method for preparing a display panel provided in the embodiments of the present disclosure, a TFT device is prepared on a TFT substrate, the TFT device is then transferred from the TFT substrate to a circuit board in a manner of transfer for twice, and a light-emitting device is transferred on the circuit board, so that a display panel driven by the TFT device is obtained. The production costs are low, and the display panel can achieve better electrical performance.

20 Claims, 5 Drawing Sheets

(51) Int. Cl.
   *H01L 25/16*  (2023.01)
   *H10D 86/01*  (2025.01)
   *H10D 86/40*  (2025.01)
   *H10H 20/857*  (2025.01)
(52) U.S. Cl.
   CPC ....... *H10D 86/0214* (2025.01); *H10D 86/441* (2025.01); *H10H 20/857* (2025.01)

(56) References Cited

FOREIGN PATENT DOCUMENTS

| | | | | |
|---|---|---|---|---|
| CN | 111403329 | A | | 7/2020 |
| CN | 112310119 | A | * | 2/2021 |
| CN | 113363277 | A | | 9/2021 |
| CN | 113497074 | A | | 10/2021 |
| CN | 113594197 | A | | 11/2021 |
| JP | 2004207078 | A | | 7/2004 |
| JP | 2010141287 | A | | 6/2010 |
| JP | 2010225668 | A | | 10/2010 |
| JP | 2013202830 | A | | 10/2013 |
| JP | 5547901 | B2 | | 7/2014 |
| JP | 2017098568 | A | | 6/2017 |
| JP | 2020194886 | A | | 12/2020 |
| KR | 20100067443 | A | * | 6/2010 |
| WO | 2021096099 | A1 | | 5/2021 |
| WO | WO-2021185289 | A1 | * | 9/2021 ............. H01L 24/95 |
| WO | WO-2021223086 | A1 | * | 11/2021 ........... H01L 25/167 |

OTHER PUBLICATIONS

Written Opinion of the International Search Authority in International application No. PCT/CN2021/136594, mailed on Apr. 26, 2022.
Chinese Office Action issued in corresponding Chinese Patent Application No. 202111405349.X dated Aug. 31, 2022, pp. 1-6.
Chinese Decision of Rejection issued in corresponding Chinese Patent Application No. 202111405349.X dated Jan. 20, 2023, pp. 1-3.
Japanese Office Action issued in corresponding Japanese Patent Application No. 特願2021-574293 dated Dec. 3, 2024, pp. 1-9.

* cited by examiner

METHOD FOR PREPARING DISPLAY PANEL, DISPLAY PANEL, AND ELECTRONIC DEVICE

FIELD OF INVENTION

The present disclosure relates to the field of display technologies, and in particular, to a method for preparing a display panel, a display panel, and an electronic device.

BACKGROUND OF INVENTION

Light-emitting diode (LED) display is the next generation of display technologies appearing after the liquid crystal display and organic light-emitting diode (OLED) display. The LED display panel uses LED chips (such as micro LED chips or mini LED chips) as pixel units, which are closely arranged one by one into an array. Each chip can be independently driven to light up and emit light. The LED display panel has many advantages, such as self-luminescence, high efficiency, long service life, and ultra-high resolution.

Technical Problem: The conventional method for preparing an LED display panel is to sequentially transfer IC chips and LED chips on a substrate with a circuit layout. The LED chips may be micro LED chips or mini LED chips. However, due to the relatively high costs of the IC chips, the production costs of the LED display panel are relatively high.

SUMMARY OF THE INVENTION

Technical Solution

Embodiments of the present disclosure provide a method for preparing a display panel, a display panel, and an electronic device. The production costs of the method for preparing a display panel are relatively low, and the prepared display panel has better electrical performance.

According to a first aspect, an embodiment of the present disclosure provides a method for preparing a display panel, including:
  obtaining a TFT substrate, wherein the TFT substrate includes a first base and a plurality of TFT devices disposed on the first base, and the TFT device includes an anchor layer and a device layer that are sequentially stacked; and a sacrificial layer is disposed between the TFT device and the first base, the anchor layer includes a first body and a connecting portion that are connected, the first body is disposed on a side of the sacrificial layer away from the first base, one side of the connecting portion is connected to the first body, and an other side is connected to the first base;
  removing the sacrificial layer of the TFT substrate, so that the TFT device is connected to the first base through the connecting portion of the anchor layer;
  obtaining a first transfer substrate, selectively picking up the TFT devices on the TFT substrate using the first transfer substrate, and breaking the connecting portion of the anchor layer in the TFT device that is picked up, to separate the TFT device and the first base;
  obtaining a second transfer substrate, and transferring the TFT device that is picked up from the first transfer substrate to the second transfer substrate;
  obtaining a circuit board, wherein the circuit board includes a second base, and a TFT connection line and a light-emitting device connection line that are disposed on the second base, and transferring the TFT device on the second transfer substrate to the circuit board and connecting the TFT device to the TFT connection line; and
  obtaining a light-emitting device, and transferring the light-emitting device to the circuit board and connecting the light-emitting device to the light-emitting device connection line, to prepare the display panel.

In some embodiments, both the first transfer substrate and the second transfer substrate are viscous, and an adhesive force between the second transfer substrate and the TFT device is greater than an adhesive force between the first transfer substrate and the TFT device.

In some embodiments, a material of the first transfer substrate includes polydimethylsiloxane (PDMS) with a molecular weight of 1,000 to 5,000, and a material of the second transfer substrate includes PDMS with a molecular weight of 10,000 or more.

In some embodiments, the first transfer substrate includes a second body and a protruding portion disposed on the second body, and the selectively picking up the TFT devices on the TFT substrate using the first transfer substrate includes: selectively picking up the TFT devices using the protruding portion of the first transfer substrate.

In some embodiments, a material of the anchor layer includes at least one of silicon oxide or silicon nitride, and a thickness of the anchor layer range from 0.5 μm to 2 μm.

In some embodiments, a material of the sacrificial layer includes amorphous silicon, and the removing the sacrificial layer of the TFT substrate includes: removing the sacrificial layer of the TFT substrate by selective etching.

In some embodiments, the device layer includes a gate, a gate insulation layer, an active layer, and a source and drain layer that are sequentially stacked on the anchor layer; a material of the source and drain layer is metal, and a material of the TFT connection line is metal; and
  the transferring the TFT device on the second transfer substrate to the circuit board and connecting the TFT device to the TFT connection line includes: connecting the source and drain layer of the TFT device to the TFT connection line by eutectic bonding.

In some embodiments, the material of the source and drain layer and the material of the TFT connection line are a combination of tin and silver, a combination of tin and copper, or a combination of tin and gold.

In some embodiments, the light-emitting device is a mini light-emitting diode (LED) or a micro LED.

According to a second aspect, an embodiment of the present disclosure provides a display panel, including:
  a circuit board, wherein the circuit board includes a second base, and a TFT connection line and a light-emitting device connection line that are disposed on the second base;
  a TFT device, disposed on the circuit board and connected to the TFT connection line, wherein the TFT device includes a source and drain layer, an active layer, a gate insulation layer, a gate, and an anchor layer that are sequentially stacked on the circuit board, and the source and drain layer is connected to the TFT connection line; and
  a light-emitting device, disposed on the circuit board and connected to the light-emitting device connection line.

In some embodiments, a material of the source and drain layer is metal, a material of the TFT connection line is metal, and there is a eutectic bonding structure between the source and drain layer and the TFT connection line.

In some embodiments, the material of the source and drain layer and the material of the TFT connection line are a combination of tin and silver, a combination of tin and copper, or a combination of tin and gold.

In some embodiments, a material of the anchor layer includes at least one of silicon oxide or silicon nitride, and a thickness of the anchor layer ranges from 0.5 μm to 2 μm. According to a third aspect, an embodiment of the present disclosure provides an electronic device, including the foregoing display panel.

Beneficial Effects

In the method for preparing a display panel provided in the embodiments of the present disclosure, a TFT device is prepared on a TFT substrate, the TFT device is then transferred from the TFT substrate to a circuit board in a manner of transfer for twice, and a light-emitting device is transferred on the circuit board, so that a display panel driven by the TFT device is obtained. Compared with the conventional preparation method for transferring an IC chip, the method for preparing a display panel of the embodiments of the present disclosure has lower production costs. In addition, a TFT connection line and a light-emitting device connection line in the display panel prepared in the embodiments of the present disclosure can be set to larger thicknesses, so that the display panel can achieve better electrical performance.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following descriptions are merely some embodiments of the present disclosure, and a person skilled in the art may further obtain other accompanying drawings according to the accompanying drawings without creative efforts.

To understand the present disclosure and the beneficial effects thereof more completely, descriptions are made below with reference to the accompanying drawings, and the same reference numerals in the accompanying drawings represent the same components.

DETAILED DESCRIPTION OF PREFERRED EMBODIMENTS

The following clearly and completely describes technical solutions in embodiments of the present disclosure with reference to the accompanying drawings in the embodiments of the present disclosure. Apparently, the described embodiments are only some embodiments rather than all the embodiments of the present disclosure. All other embodiments obtained by a person skilled in the art based on the embodiments of the present disclosure without creative efforts shall fall within the protection scope of the present disclosure.

Figure 1:
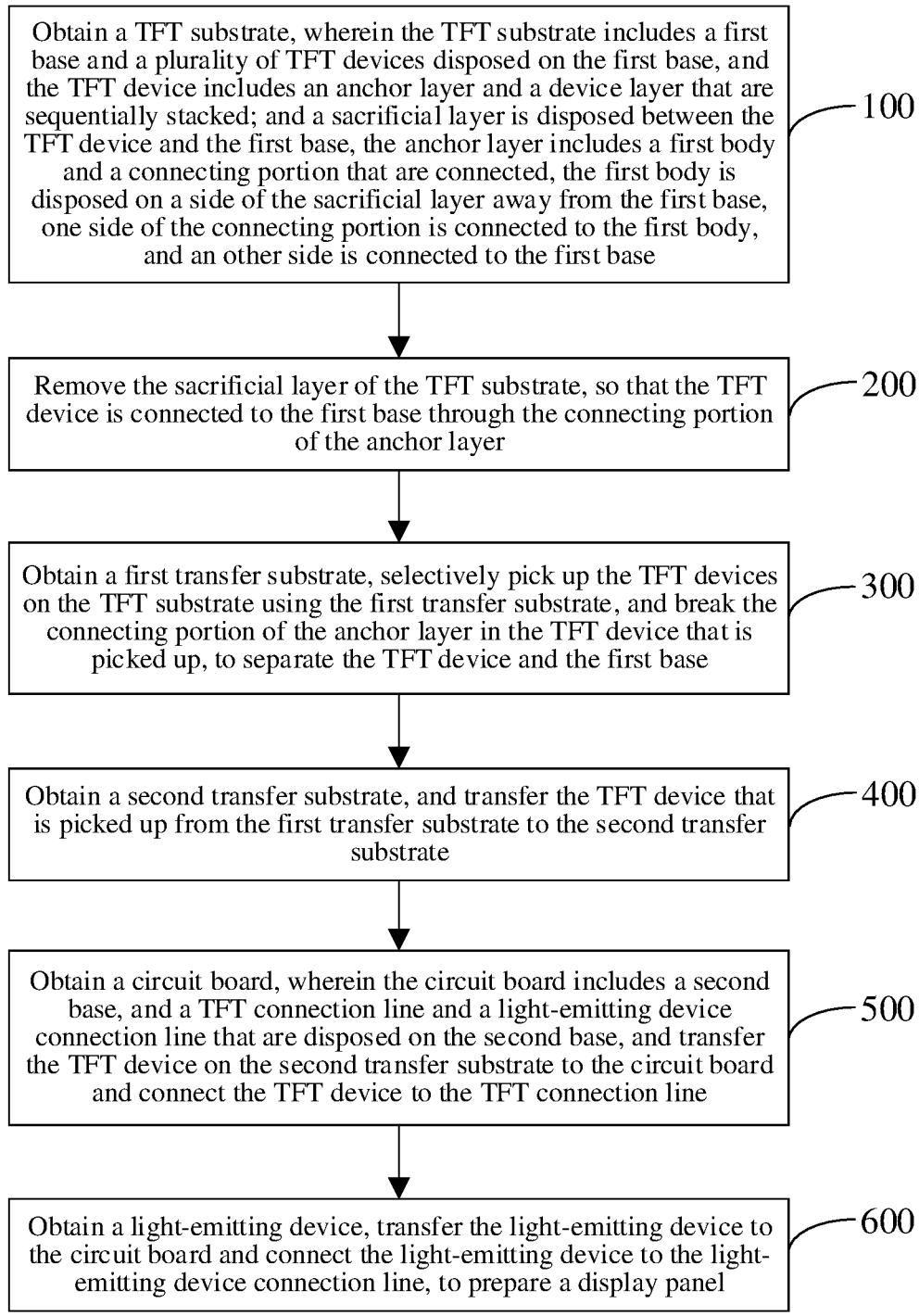
FIG. 1 is a flowchart of a method for preparing a display panel according to an embodiment of the present disclosure.

FIG. 1 is a flowchart of a method for preparing a display panel according to an embodiment of the present disclosure. An embodiment of the present disclosure provides a method for preparing a display panel, including following steps of:

100. Obtain a thin film transistor (TFT) substrate 10, wherein the TFT substrate 10 includes a first base 11 and a plurality of TFT devices 12 disposed on the first base 11, and the TFT device 12 includes an anchor layer 121 and a device layer that are sequentially stacked; and a sacrificial layer 135 is disposed between the TFT device 12 and the first base 11, the anchor layer 121 includes a first body 101 and a connecting portion 102 that are connected, the first body 101 is disposed on a side of the sacrificial layer 135 away from the first base 11, one side of the connecting portion 102 is connected to the first body 101, and an other side is connected to the first base 11.

Figure 2:
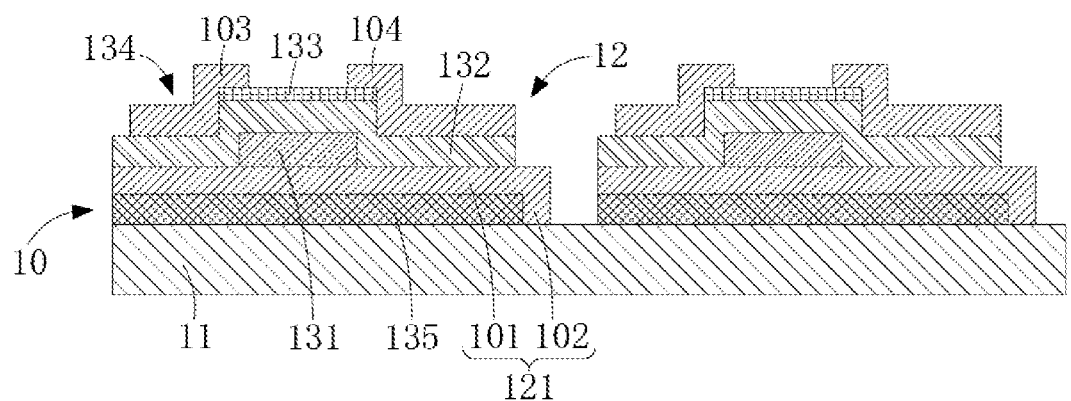
FIG. 2 is a schematic diagram of a structure of a TFT substrate according to an embodiment of the present disclosure.

FIG. 2 is a schematic diagram of a structure of a TFT substrate according to an embodiment of the present disclosure. The device layer may include a gate 131, a gate insulation layer 132, an active layer 133, and a source and drain layer 134 that are sequentially stacked on the anchor layer 121. The source and drain layer 134 may include a source 103 and a drain 104 disposed at an interval, and both the source 103 and the drain 104 are connected to the active layer 133.

Exemplarily, the anchor layer 121 may have greater brittleness and a thinner thickness. Therefore, when the sacrificial layer 135 of the TFT substrate 10 is removed, the TFT device 12 is connected to the first base 11 only through the connecting portion 102 of the anchor layer 121. Due to the greater brittleness and thinner thickness, the connecting portion 102 is easily broken, so that the TFT device 12 can be separated from the TFT substrate 10.

Exemplarily, a material of the anchor layer 121 may include at least one of silicon oxide or silicon nitride, and a thickness of the anchor layer 121 may be 0.5 μm to 2 μm (for example, 0.5 μm, 0.7 μm, 1 μm, 1.3 μm, 1.5 μm, 1.7 μm, or 2 μm).

Exemplarily, a material of the sacrificial layer 135 may include amorphous silicon.

Exemplarily, a material of the active layer 133 may be a semiconductor material, for example, a semiconductor material of amorphous silicon, polysilicon, or metal oxide.

Exemplarily, a material of the gate 131 may include at least one of molybdenum, aluminum, copper, or titanium, and a material of the gate insulation layer 132 may include at least one of silicon oxide or silicon nitride.

Exemplarily, the first base 11 may be a hard substrate, for example, a glass substrate.

200. Remove the sacrificial layer 135 of the TFT substrate 10, so that the TFT device 12 is connected to the first base 11 through the connecting portion 102 of the anchor layer 121.

Figure 3:
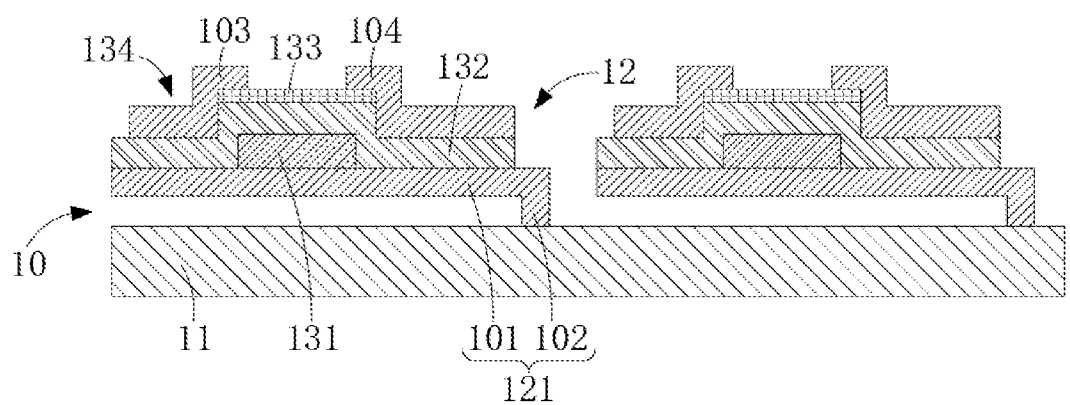
FIG. 3 is a schematic diagram of removing a sacrificial layer of a TFT substrate according to an embodiment of the present disclosure.

FIG. 3 is a schematic diagram of removing a sacrificial layer of a TFT substrate according to an embodiment of the present disclosure. When the material of the sacrificial layer 135 is amorphous silicon, the "removing the sacrificial layer 135 of the TFT substrate 10" may further include: removing the sacrificial layer 135 of the TFT substrate 10 by selective etching. That is, the TFT substrate 10 may be etched using an etching solution that can only etch amorphous silicon but cannot etch other film layers in the TFT device 12, so as to remove the sacrificial layer 135.

300. Obtain a first transfer substrate 20, selectively pick up the TFT devices 12 on the TFT substrate 10 using the first transfer substrate 20, and break the connecting portion 102 of the anchor layer 121 in the TFT device 12 that is picked up, to separate the TFT device 12 and the first base 11.

Figure 4:
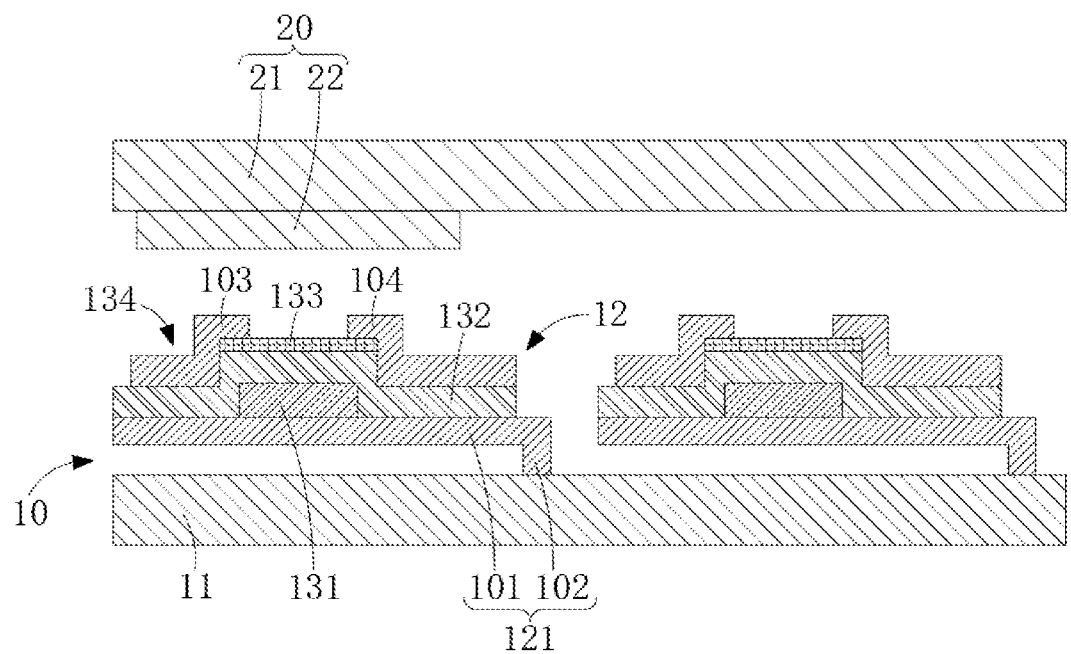
FIG. 4 and FIG. 5 are schematic diagrams of selectively picking up TFT devices on a TFT substrate using a first transfer substrate according to an embodiment of the present disclosure.
Figure 5:
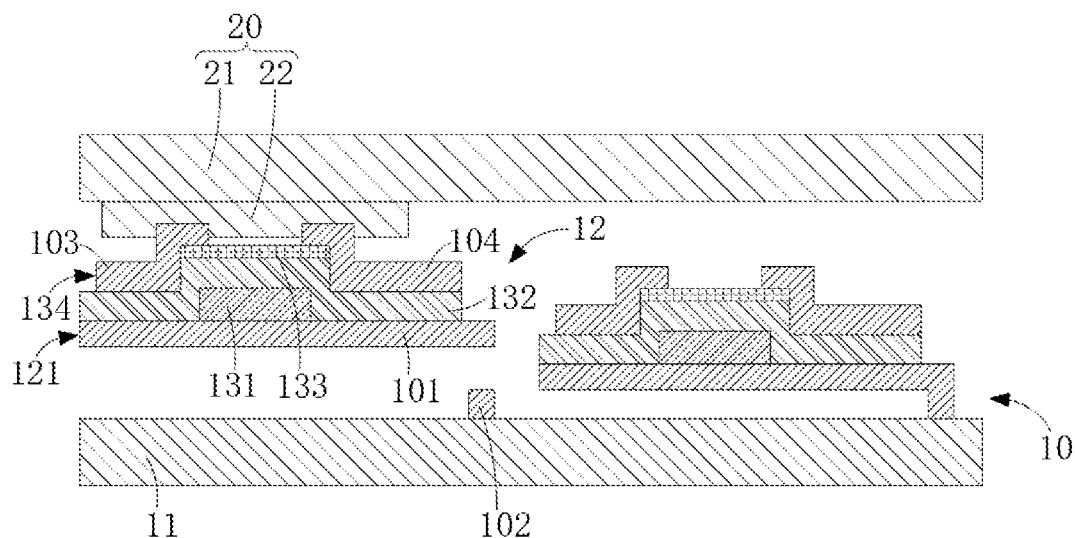

FIG. 4 and FIG. 5 are schematic diagrams of selectively picking up TFT devices on a TFT substrate using a first transfer substrate according to an embodiment of the present disclosure. The first transfer substrate 20 may be viscous, so that the TFT device 12 can be picked up from the TFT substrate 10 using the viscosity of the first transfer substrate 20.

Exemplarily, the first transfer substrate 20 includes a second body 21 and a protruding portion 22 disposed on the second body 21, and the "selectively pick up the TFT devices 12 on the TFT substrate 10 using the first transfer substrate 20" may further include: selectively picking up the TFT devices 12 using the protruding portion 22 of the first transfer substrate 20. That is, the protruding portion 22 may be disposed at a position of the second body 21 corresponding to the TFT device 12 that requires to be picked up. Therefore, after the protruding portion 22 is used to press the TFT device 12, the TFT device 12 connected to the protruding portion 22 on the TFT substrate 10 may be picked up, and the TFT device 12 that is not connected to the protruding portion 22 is not picked up.

Exemplarily, the protruding portion 22 may be elastic, so that the protruding portion 22 can be deformed when pressed onto the TFT device 12, to match the shape of the TFT device 12.

Exemplarily, a surface of a side of the protruding portion 22 away from the second body 21 may be a flat surface, a convex cambered surface, a concave cambered surface, or the like.

Exemplarily, a material of the first transfer substrate 20 may be polydimethylsiloxane (PDMS).

400. Obtain a second transfer substrate 30, and transfer the TFT device 12 that is picked up from the first transfer substrate 20 to the second transfer substrate 30.

Figure 6:
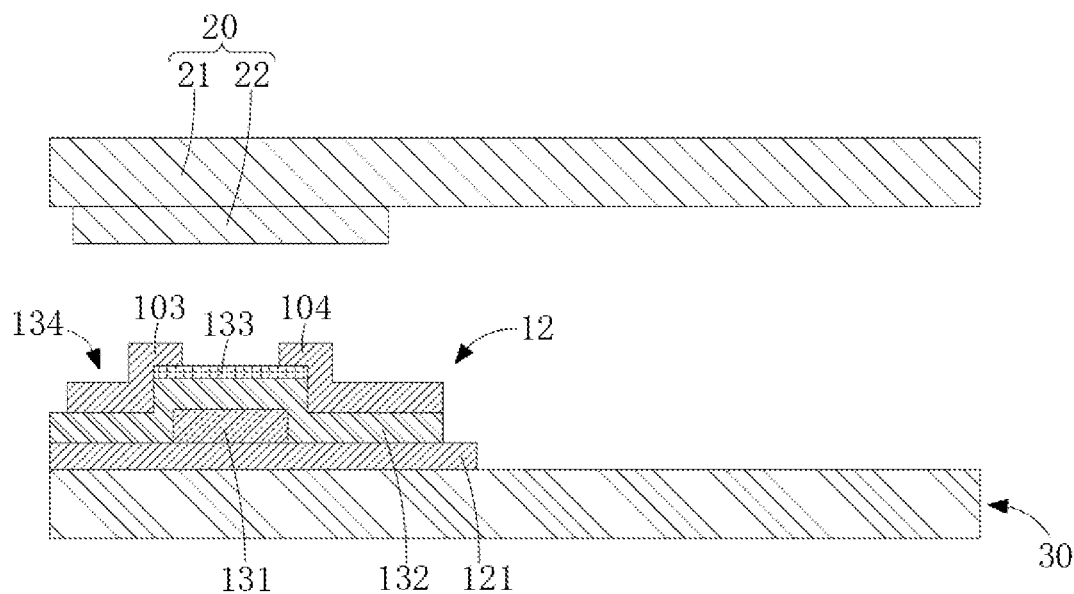
FIG. 6 is a schematic diagram of transferring a TFT device that is picked up from a first transfer substrate to a second transfer substrate according to an embodiment of the present disclosure.

FIG. 6 is a schematic diagram of transferring a TFT device that is picked up from a first transfer substrate to a second transfer substrate according to an embodiment of the present disclosure. The second transfer substrate 30 may also be viscous, and the viscosity of the second transfer substrate 30 is greater than the viscosity of the first transfer substrate 20. It may be understood that when an adhesive force between the second transfer substrate 30 and the TFT device 12 is greater than an adhesive force between the first transfer substrate 20 and the TFT device 12, the TFT device 12 on the first transfer substrate 20 may be transferred to the second transfer substrate 30 using the advantage of the greater viscosity of the second transfer substrate 30.

Exemplarily, a material of the first transfer substrate 20 may be PDMS with a molecular weight of 1,000 to 5,000, and a material of the second transfer substrate 30 may be PDMS with a molecular weight of 10,000 or more.

500. Obtain a circuit board 40, wherein the circuit board 40 includes a second base 41, and a TFT connection line 42 and a light-emitting device connection line 43 that are disposed on the second base 41, and transfer the TFT device 12 on the second transfer substrate 30 to the circuit board 40 and connect the TFT device 12 to the TFT connection line 42.

Figure 7:
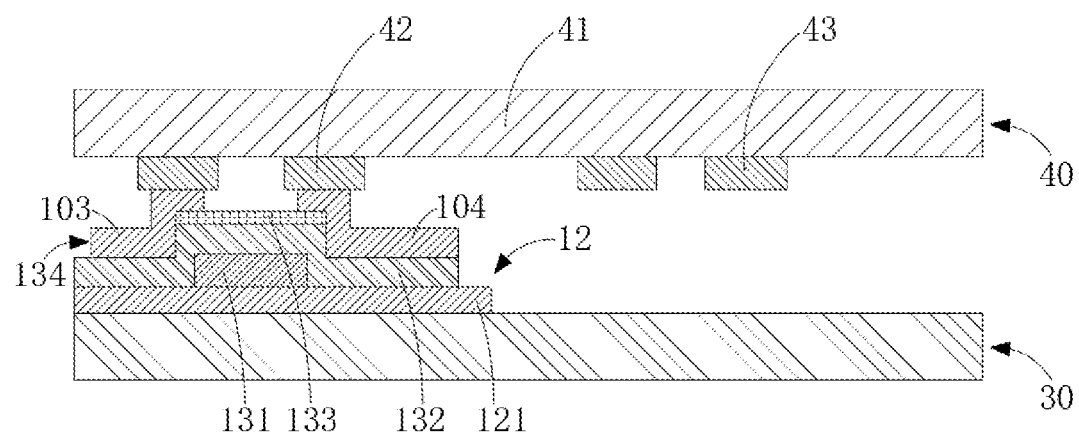
FIG. 7 is a schematic diagram of transferring a TFT device on a second transfer substrate to a circuit board according to an embodiment of the present disclosure.

FIG. 7 is a schematic diagram of transferring a TFT device on a second transfer substrate to a circuit board according to an embodiment of the present disclosure. A material of the source and drain layer 134 may be metal, and a material of the TFT connection line 42 may be metal. The "transferring the TFT device 12 on the second transfer substrate 30 to the circuit board 40 and connecting the TFT device 12 to the TFT connection line 42" may further include: connecting the source and drain layer 134 of the TFT device 12 to the TFT connection line 42 by eutectic bonding. The tensile strength of a eutectic bonding structure between the source and drain layer 134 and the TFT connection line 42 is relatively large, that is, a bonding force of the eutectic bonding structure is much greater than the adhesive force between the TFT device 12 and the second transfer substrate 30. Therefore, the second transfer substrate 30 can be peeled off from the TFT device 12, so that the TFT device 12 remains on the circuit board 40.

It should be noted that, eutectic bonding means that two metals that can form a eutectic at a eutectic temperature are in contact with each other, and after mutual diffusion, a liquid alloy with eutectic composition can be formed between the two metals. As time prolongs, the liquid layer continues to thicken, and after cooling, the two metals continue to be alternately precipitated by the liquid layer. Each metal grows and crystallizes based on an original solid phase thereof. Therefore, the two metals can be closely combined by the eutectic between the two metals.

Exemplarily, the material of the source and drain layer 134 and the material of the TFT connection line 42 are a combination of tin and silver, a combination of tin and copper, or a combination of tin and gold. It should be noted that, the combination of tin and silver means that one of the source and drain layer 134 and the TFT connection line 42 is made of tin, and the other is made of silver. This is the same for the combination of tin and copper and the combination of tin and gold.

It may be understood that the gate 131 of the TFT device 12 also requires to be connected to the TFT connection line 42. For example, a via hole may be disposed on the gate insulation layer 132 under the gate 131 and a wire connected to the gate 131 may be disposed in the via hole. A part of the wire exposed to an end of the via hole away from the gate 131 is then set to be connected to the TFT connection line 42, that is, the TFT connection line 42 includes not only lines connected to the source 103 and the drain 104, but also includes a line connected to the gate 131. Exemplarily, a connection between the wire connected to the gate 131 and the TFT connection line 42 may also be eutectic bonding.

Exemplarily, the second base 41 of the circuit board 40 may be a hard substrate or a flexible substrate. The hard substrate may be a glass substrate or the like, and a material of the flexible substrate may be a polymer material, such as polyimide or polyester.

Exemplarily, the material of the TFT connection line 42 and a material of the light-emitting device connection line 43 may both be metal, for example, copper.

Exemplarily, a thickness of the TFT connection line 42 and a thickness of the light-emitting device connection line 43 may both be 10 μm or more (for example, 10 μm, 15 μm, 20 μm, 25 μm, 35 μm, or 40 μm)

600. Obtain a light-emitting device 50, transfer the light-emitting device 50 to the circuit board 40 and connect the light-emitting device 50 to the light-emitting device connection line 43, to prepare a display panel 100.

Figure 8:
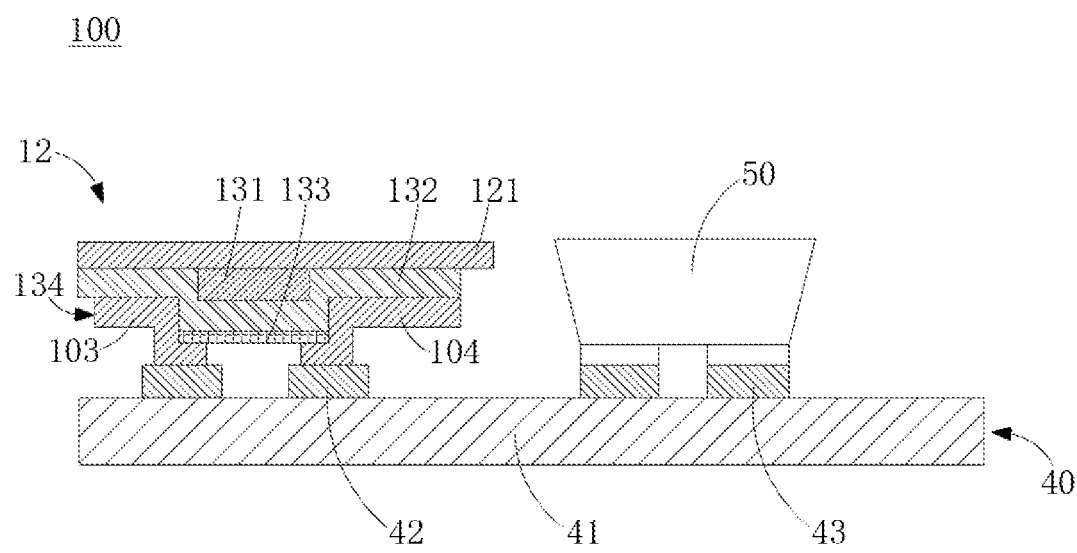
FIG. 8 is a schematic diagram of a structure of a display panel prepared according to an embodiment of the present disclosure.

FIG. 8 is a schematic diagram of a structure of a display panel prepared according to an embodiment of the present disclosure. The light-emitting device 50 may be a micro LED, and in this case, the display panel 100 prepared in the embodiments of the present disclosure is a micro LED display panel.

Exemplarily, the light-emitting device 50 may alternatively be a mini LED, and in this case, the display panel 100 prepared in the embodiments of the present disclosure is a mini LED display panel.

Exemplarily, a size of the mini LED may be 100 μm to 200 μm, and a size of the micro LED may be 30 μm or less.

Exemplarily, the light-emitting device 50 may be connected to the light-emitting device connection line 43 by welding.

It may be seen that in the technical solutions of the present disclosure, the TFT device 12 is first prepared on the TFT substrate 10, and the TFT device 12 is then transferred to the circuit board 40. Compared with the conventional technical solution that a Micro IC is first prepared, and the Micro IC is then transferred to a circuit board, production costs of the TFT device 12 are much lower than production costs of the Micro IC. Therefore, production costs of the display panel can be greatly reduced.

Another conventional method for preparing a micro LED display panel is to prepare a TFT substrate first, in which a TFT device, a TFT connection line, a light-emitting device connection line, and the like are formed, and then transfer a micro LED on the TFT substrate to obtain a micro LED display panel. However, a problem in this method is that the TFT connection line, the light-emitting device connection line, and the TFT device are prepared in the same production process. Because a thickness of a film layer in the TFT device is thinner, a thickness of the TFT connection line and a thickness of light-emitting device connection line are also thinner, which leads to poor signal conduction performance of the TFT connection line and the light-emitting device connection line, resulting in poor electrical performance of the micro LED display panel. In the embodiments of the present disclosure, the TFT device 12 is prepared separately from the TFT connection line 42 and the light-emitting device connection line 43. The TFT device 12 is prepared on the TFT substrate 10, and meanwhile, the TFT connection line 42 and the light-emitting device connection line 43 are prepared on the circuit board 40. That is, a process of preparing the TFT connection line 42 and the light-emitting device connection line 43 is separated from a process of preparing the TFT device 12, so that the thickness of the TFT connection line 42 and the thickness of the light-emitting device connection line 43 are no longer limited to the thickness of the TFT device 12. The TFT connection line 42 and the light-emitting device connection line 43 can be prepared to larger thicknesses (10 μm or more), so that the TFT connection line 42 and the light-emitting device connection line 43 have better signal conduction performance, and thus the display panel 100 has better electrical performance.

Based on the above, in the method for preparing a display panel provided in the embodiments of the present disclosure, the TFT device 12 is prepared on the TFT substrate 10, the TFT device 12 is then transferred from the TFT substrate 10 to the circuit board 40 in a manner of transfer for twice, and the light-emitting device 50 is transferred on the circuit board 40, so that the display panel 100 driven by the TFT device is obtained. Compared with the conventional preparation method for transferring an IC chip, the method for preparing the display panel 100 of the embodiments of the present disclosure has lower production costs. In addition, the TFT connection line 42 and the light-emitting device connection line 43 in the display panel 100 prepared in the embodiments of the present disclosure can be set to larger thicknesses, so that the display panel 100 can achieve better electrical performance.

Referring to FIG. 8, an embodiment of the present disclosure further provides a display panel 100, which can be prepared using the preparation method in any of the above embodiments. The display panel 100 may include a circuit board 40, and a TFT device 12 and a light-emitting device 50 that are disposed on the circuit board 40. The circuit board 40 includes a second base 41, and a TFT connection line 42 and a light-emitting device connection line 43 that are disposed on the second base 41. The light-emitting device 50 is connected to the light-emitting device connection line 43.

The TFT device 12 is connected to the TFT connection line 42. The TFT device 12 includes a source and drain layer 134, an active layer 133, a gate insulation layer 132, a gate 131, and an anchor layer 121 that are sequentially stacked on the circuit board 40, wherein the source and drain layer 134 is connected to the TFT connection line 42.

Exemplarily, a material of the source and drain layer 134 is metal, a material of the TFT connection line 42 is metal, and there is a eutectic bonding structure between the source and drain layer 134 and the TFT connection line 42.

The gate insulation layer 132 may be provided with a via hole, and a wire connected to the gate 131 may be disposed in the via hole. An end of the wire away from the gate 131 may be set to be connected to the TFT connection line 42. Exemplarily, a connection between the wire connected to the gate 131 and the TFT connection line 42 may also be eutectic bonding.

Exemplarily, the material of the source and drain layer 134 and the material of the TFT connection line 42 are a combination of tin and silver, a combination of tin and copper, or a combination of tin and gold.

Exemplarily, a material of the anchor layer 121 may include at least one of silicon oxide or silicon nitride, and a thickness of the anchor layer 121 may be 0.5 μm to 2 μm (for example, 0.5 μm, 0.7 μm, 1 μm, 1.3 μm, 1.5 μm, 1.7 μm, or 2 μm).

Exemplarily, the material of the TFT connection line 42 and a material of the light-emitting device connection line 43 may both be metal, for example, copper.

Exemplarily, a thickness of the TFT connection line 42 and a thickness of the light-emitting device connection line 43 may be 10 μm or more (for example, 10 μm, 15 μm, 20 μm, 25 μm, 35 μm, or 40 μm)

An embodiment of the present disclosure further provides an electronic device, including the display panel 100 in any one of the above embodiments.

Exemplarily, the electronic device may be a device with a display screen, such as a television, a mobile phone, a tablet computer, a liquid crystal display, a game device, or a wearable device, wherein the wearable device may be a smart bracelet, smart glasses, a smart watch, a smart decoration, or the like.

The method for preparing a display panel, the display panel, and the electronic device provided in the embodiments of the present disclosure are described in detail above. The principles and implementations of the present disclosure are described through specific examples in this specification, and the descriptions of the embodiments are only intended to help understand the present disclosure. Meanwhile, a person skilled in the art may make modifications to the specific implementations and application scopes according to the ideas of the present disclosure. In conclusion, the content of the specification should not be construed as a limitation to the present disclosure.

What is claimed is:

1. A method for preparing a display panel, comprising following steps:
   obtaining a thin film transistor (TFT) substrate, wherein the TFT substrate comprises a first base and a plurality of TFT devices disposed on the first base, and the TFT device comprises an anchor layer and a device layer that are sequentially stacked; and a sacrificial layer is disposed between the TFT device and the first base, the anchor layer comprises a first body and a connecting portion that are connected, the first body is disposed on a side of the sacrificial layer away from the first base, one side of the connecting portion is connected to the first body, and an other side is connected to the first base;
   removing the sacrificial layer of the TFT substrate, so that the TFT device is connected to the first base through the connecting portion of the anchor layer;
   obtaining a first transfer substrate, selectively picking up the TFT devices on the TFT substrate using the first transfer substrate, and breaking the connecting portion of the anchor layer from the first body of the anchor layer in the TFT device that is picked up, to separate the TFT device with the first body from the first base of the TFT substrate;
   obtaining a second transfer substrate, and transferring the TFT device with the first body that is picked up from the first transfer substrate to the second transfer substrate;
   obtaining a circuit board, wherein the circuit board comprises a second base, and a TFT connection line and a light-emitting device connection line that are disposed on the second base, and transferring the TFT device on the second transfer substrate to the circuit board and connecting the TFT device to the TFT connection line; and
   obtaining a light-emitting device, and transferring the light-emitting device to the circuit board and connecting the light-emitting device to the light-emitting device connection line, to prepare the display panel.

2. The method for preparing a display panel as claimed in claim 1, wherein both of the first transfer substrate and the second transfer substrate are viscous, and an adhesive force between the second transfer substrate and the TFT device is greater than an adhesive force between the first transfer substrate and the TFT device.

3. The method for preparing a display panel as claimed in claim 2, wherein a material of the first transfer substrate comprises polydimethylsiloxane (PDMS) with a molecular weight of 1,000 to 5,000, and a material of the second transfer substrate comprises PDMS with a molecular weight of 10,000 or more.

4. The method for preparing a display panel as claimed in claim 1, wherein the first transfer substrate comprises a second body and a protruding portion disposed on the second body, and the selectively picking up the TFT devices on the TFT substrate using the first transfer substrate comprises: selectively picking up the TFT devices using the protruding portion of the first transfer substrate.

5. The method for preparing a display panel as claimed in claim 4, wherein a surface of a side of the protruding portion away from the second body is a flat surface, a convex cambered surface, or a concave cambered surface.

6. The method for preparing a display panel as claimed in claim 1, wherein a material of the anchor layer comprises at least one of silicon oxide or silicon nitride.

7. The method for preparing a display panel as claimed in claim 1, wherein a thickness of the anchor layer ranges from 0.5 μm to 2 μm.

8. The method for preparing a display panel as claimed in claim 1, wherein a material of the sacrificial layer comprises amorphous silicon, and the removing the sacrificial layer of the TFT substrate comprises: removing the sacrificial layer of the TFT substrate by selective etching.

9. The method for preparing a display panel as claimed in claim 1, wherein the device layer comprises a gate, a gate insulation layer, an active layer, and a source and drain layer that are sequentially stacked on the anchor layer; a material of the source and drain layer is metal, and a material of the TFT connection line is metal; and
   the transferring the TFT device on the second transfer substrate to the circuit board and connecting the TFT device to the TFT connection line comprises: connecting the source and drain layer of the TFT device to the TFT connection line by eutectic bonding.

10. The method for preparing a display panel as claimed in claim 9, wherein the material of the source and drain layer and the material of the TFT connection line are a combination of tin and silver, a combination of tin and copper, or a combination of tin and gold.

11. The method for preparing a display panel as claimed in claim 1, wherein the light-emitting device is a mini light-emitting diode (LED) or a micro LED.

12. The method for preparing a display panel as claimed in claim 1, wherein the TFT device is initially formed on the first base of the TFT substrate in a first process, the TFT connection line and the light-emitting device connection line are formed on the second base of the circuit board in a second process that is separate from the first process, and then the TFT device is subsequently transferred from the first base of TFT substrate to the circuit board and connected to the TFT connection line in a third process; and
   wherein a thickness of the TFT connection line and a thickness of the light-emitting device connection line are both greater than a thickness of the TFT device.

13. A display panel, comprising:
   a circuit board, wherein the circuit board comprises a second base, and a thin film transistor (TFT) connection line and a light-emitting device connection line that are disposed on the second base;
   a TFT device, disposed on the circuit board and connected to the TFT connection line, wherein the TFT device comprises a source and drain layer, an active layer, a gate insulation layer, a gate, and an anchor layer that are sequentially stacked on the circuit board, and the source and drain layer is connected to the TFT connection line; and
   a light-emitting device, disposed on the circuit board and connected to the light-emitting device connection line;
   wherein the TFT device is initially formed on a first base of a TFT substrate in a separate process from forming the TFT connection line and the light-emitting device connection line on the circuit board, and the TFT device is then subsequently transferred to the circuit board and connected to the TFT connection line; and wherein thicknesses of the TFT connection line and the light-emitting device connection line are both greater than a thickness of the TFT device.

14. The display panel as claimed in claim 13, wherein a material of the source and drain layer is metal, a material of the TFT connection line is metal, and there is a eutectic bonding structure between the source and drain layer and the TFT connection line.

15. The display panel as claimed in claim 14, wherein the material of the source and drain layer and the material of the TFT connection line are a combination of tin and silver, a combination of tin and copper, or a combination of tin and gold.

16. The display panel as claimed in claim 13, wherein a material of the anchor layer comprises at least one of silicon oxide or silicon nitride.

17. The display panel as claimed in claim 13, wherein a thickness of the anchor layer ranges from 0.5 μm to 2 μm.

18. The display panel as claimed in claim 13, wherein the thickness of the TFT connection line and the thickness of the light-emitting device connection line are both 10 μm or more.

19. The display panel as claimed in claim 13, wherein the light-emitting device is connected to the light-emitting device connection line by welding.

20. The display panel as claimed in claim 13, wherein a material of the TFT connection line and a material of the light-emitting device connection line are both metal.

\* \* \* \* \*